United States Patent [19]
Yamazaki et al.

[11] 3,959,728
[45] May 25, 1976

[54] LOCAL OSCILLATION CIRCUIT FOR TUNER HAVING REDUCED INTER-CHANNEL DEVIATION IN AFC SENSITIVITY

[75] Inventors: Kazuhiko Yamazaki, Fujisawa; Takeshi Saitoh; Yoshio Miura, both of Yokohama, all of Japan

[73] Assignee: Hitachi, Ltd., Japan

[22] Filed: Jan. 15, 1975

[21] Appl. No.: 541,114

[30] Foreign Application Priority Data
Jan. 18, 1974 Japan.................................. 49-7919
June 5, 1974 Japan................................ 49-62954

[52] U.S. Cl............................ 325/422; 178/5.8 AF; 331/36 C; 334/16
[51] Int. Cl.²....................... H03B 3/04; H04B 1/16
[58] Field of Search............... 178/5.8 AF; 325/346, 325/418, 419, 420, 421, 422, 453, 454, 464; 334/16; 331/36 C

[56] References Cited
UNITED STATES PATENTS
2,811,647 10/1957 Nilssen.............................. 331/36 C
3,219,944 11/1965 Kauszetal........................... 331/36 C
3,353,126 11/1967 Schucht................................. 334/78
3,679,990 7/1972 Hiday et al........................ 331/36 C
3,784,917 1/1974 Kenyon................................ 325/422
3,825,858 7/1974 Amemiya et al.................. 331/117 R

*Primary Examiner*—Robert L. Griffin
*Assistant Examiner*—Marc E. Bookbinder
*Attorney, Agent, or Firm*—Craig & Antonelli

[57] ABSTRACT

A local oscillation circuit for a tuner having a reduced inter-channel deviation in AFC sensitivity. The local oscillation circuit comprises a resonance circuit capable of varying a tuning frequency by means of a variable capacitive element additionally provided with a variable capacitive diode which is applied with a control voltage in dependence upon variation in the frequency detected from the output signal of the tuner, thereby to effect an automatic frequency control. A single variable capacitive diode is coupled to the variable capacitive element of the resonance circuit in a parallel and a series connections.

4 Claims, 7 Drawing Figures

LOCAL OSCILLATION CIRCUIT FOR TUNER HAVING REDUCED INTER-CHANNEL DEVIATION IN AFC SENSITIVITY

The present invention relates to a tuner provided with an automatic frequency control circuit for finely tuning local oscillation frequency. In more particular, the invention relates to a local oscillation circuit in which the oscillation frequency is varied by means of a variable capacitive element and inter-channel deviation of the control sensitivity (i.e., variations of the local oscillation frequency responsive to variations of the AFC voltage being non-constant between different channels) is reduced in the automatic frequency control.

An object of the present invention is to provide a local oscillation circuit for a tuner in a television receiver in which the inter-channel deviation in the control sensitivity of the automatic frequency control circuit is reduced.

Another object of the invention is to provide a local oscillation circuit of the tuner which allows the reduction of the inter-channel deviation in the control sensitivity of the automatic frequency control circuit with a simplified circuit arrangement.

To accomplished the above and other objects which will be made clearer hereinafter, the present invention proposes to connect a variable capacitive diode for the automatic frequency control to both ends of a variable capacitive diode for the tuning in the resonance circuit by way of two capacitors, respectively. With such arrangement, it is possible to reduce the inter-channel deviation in the control sensitivity of the automatic frequency control circuit in such manner in which influence to the resonance circuit exerted by a predetermined amount of variation or change in the capacitance of the variable capacitive diode for the automatic frequency control may remain substantially constant independently from the selected frequencies or channels.

The above and other objects, novel features and advantages of the present invention will become more apparent from the description of preferred embodiments of the invention made with reference to the accompanying drawings, in which.

Figure 3:
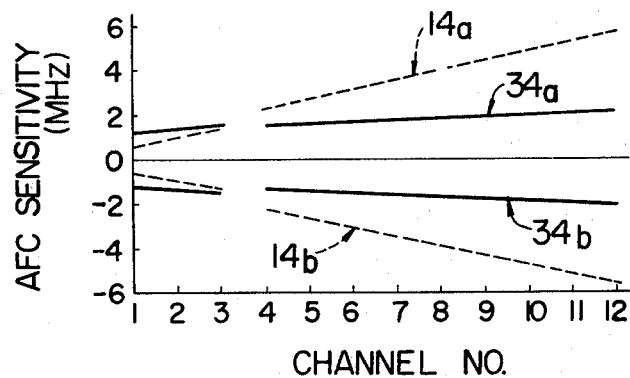
Figure 4:
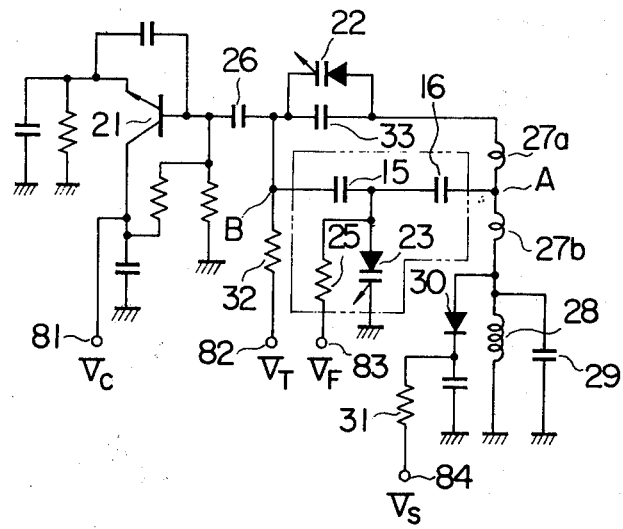
Figure 5:
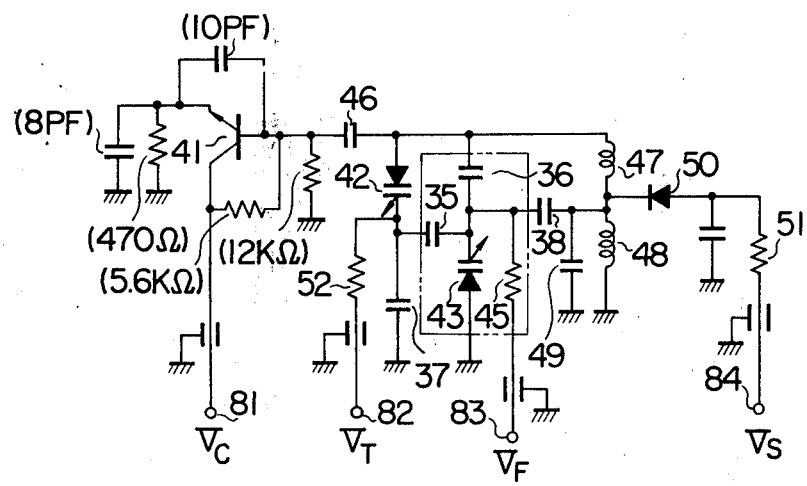
Figure 6:
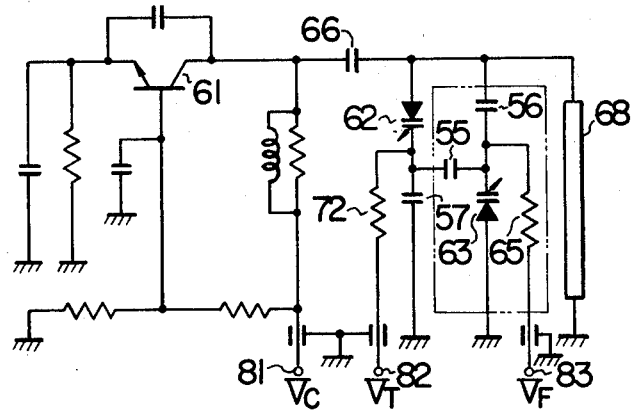

FIG. 3 graphically illustrates sensitivities of the automatic frequency control of the conventional and the inventive local oscillation circuits as a function of frequencies or channels; and FIGS. 4 to 6 show embodiments of the invention.

For the local oscillation circuit employed in the VHF or UHF tuner of the television receiver, following requirements have to be fulfilled:

1. Oscillation output must be produced in a stablized manner.
2. The circuit must be evaded from the parasitic oscillation.
3. No variation should occur in the frequency of the oscillation under the influence of changes in the source voltage, ambient temperature, humidity or the like.

Among the above requirements, it is difficult to completely suppress the variation in the oscillation frequency. Accordingly, in order to meet the last mentioned requirement (3), man resorts to the use of a so-called automatic frequency control (hereinafter referred to simply as AFC) in which variations in the oscillation frequency are detected thereby to control the oscillation circuit in such manner that the variations may be decreased.

Figure 1:
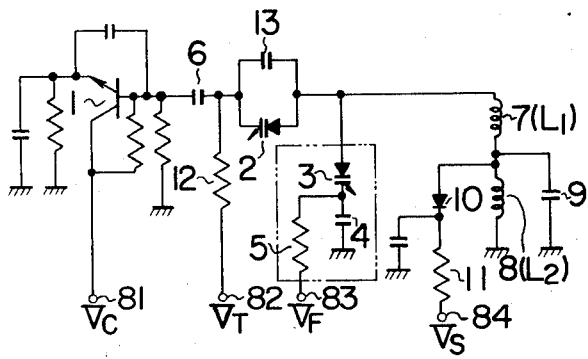
FIG. 1 is a circuit diagram showing a local oscillation circuit employed in a heretofore known VHF tuner.

FIG. 1 shows an example of a hitherto known local oscillation circuit of the VHF tuner operative on the basis of the AFC principle. Referring to FIG. 1, reference numeral 1 denotes a transistor for oscillation having a terminal 81 adapted to be applied with a source voltage Vc for operating the transistor 1. Numeral 2 indicates a tuning diode of a variable capacitance type for varying the oscillation frequency. Tuning voltage $V_T$ applied to a terminal 82 is fed to the variable capacitive diode 2 by way of a bias resistor 12. Numeral 7 denotes a tuning coil for a high frequency band, while 8 denotes a tuning coil for a low frequency band. These tuning coils 7 and 8 constitute a resonance circuit connected in series to the variable capacitive diode 2.

For changing-over the high and the low bands to each other, a switching diode 10 is provided to which a switching voltage Vs is applied from a terminal 84 through a bias resistor 11. The switching voltage Vs is so selected that the switching diode 10 is cut off when the low band is received, while at the time of receiving the high band the switching diode 10 is made conductive. Accordingly, when the low band is received, the inductance for constituting the resonance circuit corresponds to the sum of the inductances of the coils 7 and 8. On the contrary, the inductance of the resonance circuit is provided only by the coil 7 in the mode of receiving the high band, since the coil 8 is shunted by the switching diode 10.

A cpacitor 6 serves for coupling the resonance circuit to the transistor 1. Simultaneously, the capacitor 6 is cooperative with a capacitor 13 so that the local oscillation frequency may be varied with a constant difference maintained relative to the variation in the tuned frequency of the high frequency amplifier circuit causes by the variation in the tuning voltage $V_T$ for the selection of channel in the mode for receiving the high band. In other words, the capacitors 6 and 13 serve to improve a so-called tracking characteristic. The capacitor 9 which is connected in parallel to the coil 8 is also operative to improved the tracking characteristic in the low-band receiving mode.

Reference numeral 3 designates a variable capacitive diode to which AFC voltage $V_F$ is applied from a terminal 83 by way of a resistor 5. The AFC voltage $V_F$ is produced by a circuit (not shown) which is adapted to detect a deviation from a reference value of the carrier frequency of the output signal from the tuner. The AFC voltage $V_F$ brings about a corresponding variation in the capacitance of the variable capacitive diode 3, which in turn will make the carrier frequency of the output signal from the turner coincident with the reference value by varying the oscillation frequency. A capacitor 4 is provided to determine the control sensitivity for the AFC operation. In other words, the capacitance of the capacitor 4 is so selected that the magnitude of variation in the oscillation frequency for a unit variation in the AFC voltage $V_F$ applied to the variable capacitive diode 3 can be thereby determined.

In the circuit shown in FIG. 1, the channel selection is carried out by varying the tuning voltage $V_T$ applied to the terminal 82.

Figure 2A:
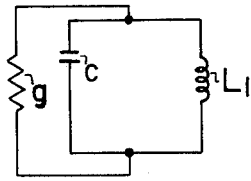
FIGS. 2a and 2b show equivalent circuits of the resonance circuit shown in FIG. 1.
Figure 2B:
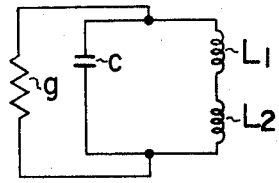

FIGS. 2a and 2b show equivalent circuits to the resonance circuit of the local oscillation circuit shown in FIG. 1. The circuit shown in FIG. 2a corresponds to the high-band receiving mode, while that of FIG. 2b corresponds to the low-band receiving mode. When the combined capacitance and the tuning inductance in these equivalent circuits are represented by C and L, respectively, the resonance frequency $f$ can be given by the following expression;

$$f = \frac{1}{2\pi \sqrt{LC}} \quad (1)$$

Assuming that the capacitance of the variable capacitive diode 3 for AFC is varied due to the change $\Delta V_F$ in the AFC voltage $V_F$, whereby the combined tuning capacitance C is varied by $\Delta C$, it follows from the above formula (1) that the variation $\Delta f$ in the tuned frequency can be expressed as follows;

$$\Delta f = -\frac{1}{2} (\Delta C/C) f \quad (2)$$

In case the VHF tuner incorporating therein the local oscillation circuit shown in FIG. 1 is tuned with the same capacitance C both for the high and the low bands with inductance L being differed, any change or deviation in the frequency $f$ is naturally accompanied with a corresponding deviation in the quantity $\Delta f$ as is apparent from the expression (2), even if the variation $\Delta C$ in the capacitance of the variable capacitive diode 3 for AFC remains at a same value. Such deviation will be in the order of factor 2 for the low and high band in the VHF channel in Japanese television system and amount to factor of about three in U.S.A. system. Moreover, being ascribable to the capacitive tuning system, the combined tuning capacitance will take a considerably great value for lower channels in every band. For this reason, the variation $\Delta f$ in the oscillation frequency $f$ for the variation of a predetermined magnitude in the AFC voltage $V_F$ will have inter-channel deviation or difference in the order of factor 4 to 5 for every channel in a receiving range, even when the variation in the capacitance of the variable capacitive diode 3 for AFC remains at a constant value for every channel. Since the AFC voltage $V_F$ is produced in dependence upon error in the frequency of the output signal from the tuner, a predetermined AFC voltage $V_F$ will appear in response to the given error or deviation in the frequency of the output signal from the tuner. Accordingly, the above described inter-channel deviation in the frequency variation $\Delta f$ can not be evaded in any channels being received.

FIG. 3 graphically illustrates actually measured results of the control sensitivity for each of the VHF channels in Japanese television system. Broken line 14a represents a variation in the oscillation frequency produced when the AFC voltage $V_F$ was selected higher than a reference voltage for a predetermined value, while the broken line 14b represents corresponding measured results taken when the AFC voltage $V_F$ was lowered from the reference value for the predetermined value. It will be noted that there is a difference in the order of factor 5 in the AFC sensitivity between the channels 1 and 12.

When the variation in the oscillation frequency relative to the unit variation in the AFC voltage $V_F$, that is, the inter-channel deviation in the control sensitivity is differed considerably from one channel to another, there may arise a difficulty that a program of a channel which is poor in the control sensitivity could not be received due to changes of the receiving conditions caused by the inadequate holding range of the AFC circuit. To the contrary, when the control sensitivity is excessively high for a given channel, the holding range of the AFC circuit will then become excessively wide, whereby signal of the undesired channel may be crosstalked into the selected given channel.

In an effort to eliminate the disadvantages as described above, there have been proposed circuits such as the one disclosed in U.S. Pat. No. 3,825,858. According to the teaching of this patent, an additional diode of a variable capacitance type is connected in series to the variable capacitive diode for AFC in the circuit arrangement shown in FIG. 1. With such arrangement, the tuning voltage $V_T$ is applied to the additional capacitive diode and the variation in the capacitance of the variable capacitive diode for AFC provided by the resonant circuit is varied in dependence upon the selected channel, thereby to decrease the inter-channel deviation in the control sensitivity. Furthermore, it has been known that the coil for the high frequency band is divided into two segments with a thus available intermediate tap point being connected to the AFC circuit. By lowering the control sensitivity for the high frequency band, the deviation or difference in the sensitivity of the AFC circuit between the low and the high bands can be reduced.

However, the above mentioned circuit arrangement is still disadvantageous in that a variable capacitive diode as well as a circuit for applying the tuning voltage thereto are additionally required, which results in a complicated and expensive tuner.

FIG. 4 is a circuit diagram showing an embodiment of the present invention.

The resonance circuit is same as the conventional one shown in FIG. 1 except that the coil for the high band of the tuning coil constituting the resonance circuit is divided into segments 27a and 27b in case of the inventive circuit shown in FIG. 4. The tuning coil 28 for the low band is connected in series to the coil segments 27a and 27b for the high-band tuning coil and adapted to be shunted by the switching diode 30 in the high-band receiving mode, which diode 30 in turn is adapted to be turned on or off by the switching voltage Vs. A parallel connection of a variable capacitive diode 22 for the tuning and a capacitor 33 for improving the tracking performance is connected in series to the tuning coils 27a, 27b and 28. The series resonance circuit thus formed is coupled to the oscillation transistor 21 through the capacitor 26. The difference of the local oscillation circuit shown in FIG. 4 from the conventional one resides in the unique coupling arrangement between the variable capacitive diode 23 for AFC and the series resonance circuit. In more detail, a pair of capacitors 15 and 16 are connected to the nongrounded electrode of the variable capacitive diode 23 for AFC, wherein the capacitor 15 is connected to the electrode of the tuning capacitive diode 22 which is not connected to the tuning coil, while the other capacitor 16 is connected to an intermediate tap point A between the coil segments 27a and 27b of the divided tuning coil for the high-band. Stated in another way, the variable capacitive diode 23 for AFC has been connected to the resonance circuit at a single circuit point thereof in case of the hitherto known local oscillator, while according to the teaching of the present invention the same diode 23 is coupled to the resonance circuit at the two circuit points thereof. Thus, neither the additional variable capacitive diode nor the means for supplying the bias voltage thereto are required according to the present invention. Provision of a fixed capacitor in excess is sufficient for the operation of the inventive circuit.

Next, the operation of the above mentioned circuit shown in FIG. 4 will be described.

Assuming that the variable capacitive diode 23 for AFC is connected only to the intermediate point A between the coil segments 27a and 27b of the high-band tuning coil with the capacitor 15 being absent, then the circuit shown in FIG. 4 takes the same circuit configuration as that of FIG. 1, whereby the combined capacitance in the equivalent circuits such as those shown in FIGS. 2a and 2b is provided by the variable capacitive diode 22 for the tuning and the diode 23 for AFC which are connected in parallel to each other. Accordingly, the influence exerted onto the combined tuning capacitance by the variation in the capacitance of the diode 23 for AFC will become more remarkable, as the capacitance of the variable capacitive diode 22 for the tuning is decreased or the frequency is increased. As a result of that, the variation in the oscillation frequency in the individual channels for a predetermined variation in the AFC voltage $V_F$ tends to become proportional to the frequency as hereinbefore described with reference to the broken curves 14a and 14b shown in FIG. 3.

Now, it is assumed that the variable capacitive diode 23 for AFC is connected to the circuit point B by way of the capacitor 15 with the capacitor 16 absent. In this case, the combined tuning capacitance as considered in the equivalent circuits shown in FIGS. 2a and 2b is produced by the series connection of the variable capacitive diode for the tuning and the diode 23 for AFC. Accordingly, the influence of the variation in the capacitance of the variable capacitive diode 23 for AFC given to the combined tuning capacitance will become more serious, as the capacitance of the variable capacitive diode 22 for the tuning is increased or the frequency $f$ is decreased. The rate of change or variation $\Delta C/C$ in the combined tuning capacitance due to the variation in the capacitance of the diode 23 for AFC can be approximately expressed as follows:

$$\frac{\Delta C}{C} \propto \frac{1}{f^2} \qquad (3)$$

Hence, it follows that the variation $\Delta f$ of the oscillation frequency due to the above capacitive change can be given by $$\Delta f \propto (1/f) \ldots \qquad 4$$

In this manner, the variation in the oscillation frequency for a predetermined or a fixed unit variation in the AFC voltage $V_F$ becomes greater, as the frequency is low and vice versa contrary to the case wherein the variable capacitive diode 23 for AFC is connected only to the tap point A through the capacitor 16.

From the foregoing discussion, it will now be appreciated that the variation in the oscillation frequency for the predetermined variation in the capacitance of the diode 23 for AFC can be made to remain substantially at a constant value independently from the frequency by connecting the diode 23 for AFC both to the circuit points B and A through the capacitors 15 and 16, respectively, thereby to superpose the reverse characteristics described above. In other words, with the circuit arrangement shown in FIG. 4, the inter-channel deviation in the sensitivity of the AFC circuit can be effectively reduced. The actual capacitances of the capacitors 15 and 16 can be experimentally easily determined to suitable values.

Measured results of the AFC sensitivity of the inventive oscillation circuit for the individual channels are represented by curves 34a and 34b in solid lines in FIG. 3.

FIG. 5 is a circuit diagram showing another embodiment of the present invention. Although the oscillation transistor 21 and the variable capacitive diode 22 for the tuning are connected in series to each other in case of the aforementioned oscillation circuit shown in FIG. 4, these circuit elements are connected in parallel to one another in the circuit configuration shown in FIG. 5.

Referring to FIG. 5, reference numeral 41 indicates an oscillation transistor which is biased with a source voltage Vc applied thereto from a terminal 81. A variable capacitive diode 42 for the tuning is applied with a tuning voltage $V_T$ from a terminal 82 through a resistor 52. A capacitor 37 serves to determine a range of variation in the resonance frequency of the resonance circuit due to the variation in capacitance of the diode 42. The resonance circuit is formed in a parallel form by a tuning coil 47 for the high-band, a tuning coil 48 for the low band and a variable capacitive diode 42. Upon the high-band reception, the low band coil 48 is shunted by a switching diode 50 whih is made conductive by a switching voltage Vs applied from a terminal 84 through a resistor 51. The parallel resonance circuit is coupled to the oscillation transistor 41 through a capacitor 46. As is in the case of the hitherto known circuit and the preceding embodiment, there is provided a capacitor 49 to improve the tracking characteristics of the high frequency circuit for the tuning frequency and the local oscillation frequency.

The AFC circuit is indicated by a block in a broken and dotted line. Numeral 43 denotes the variable capacitive diode for AFC. The AFC voltage $V_F$ applied at the terminal 83 is supplied to the variable capacitive diode 43 through a resistor 45, whereby variation in capacitance thereof is brought about in dependence upon the AFC voltage $V_F$. It will be noted that the variable capacitive diode 43 for AFC is connected to the both electrodes of the variable capacitive diode 42 through fixed capacitors 35 and 36. The capacitor 35 functions to couple the variable capacitive diode 43 for AFC in series with the variable capacitive diode 42, while the other capacitor 36 is operative to couple the diode 43 for AFC in parallel with the tuning diode 42. It will be appreciated that, also in this embodiment, the influence of the variation in the capacitance of the AFC diode 43 exerted onto the variation in the oscillation frequency can be made independent from the oscillation frequency in the similar manner as described hereinbefore in conjunction with the preceding embodiment.

Since the fixed capacitor 38 is connected in parallel with the variable capacitive diode 43 for AFC when the low-band tuning coil 43 is short-circuited by the switching transistor 48 in the conductive state, the capacitor 38 has the function to lower the control sensitivity of the AFC circuit upon the high-band reception. In this way, the deviation in the control sensitivity of the AFC circuit for the low and high-bands can be reduced.

In the following, circuit parameters or constants suitable for the local oscillation circuit shown in FIG. 5 and applied to a tuner destined to receive the channels in the Japanese television system are enumerated by way of example:

Oscillation transistor 41: 2SC 717
Variable capacitive diode 42 for the tuning: BB 105G
Capacitor 37: 22 pF
Resistor 52: 47 kΩ
Capacitor 46: 4 pF
High-band tuning coil 47: about 30 mH
Low-band tuning coil 48: about 70 mH
Variable capacitive diode 43 for AFC: 1S2268
Capacitor 35: 4pF
Capacitor 36: 2pF
Resistor 45: 47 kΩ
Capacitor 38: 2pF
Capacitor 49: 12pF Although the invention has been described in the foregoing in conjunction with the exemplary embodiments of the local oscillation circuit for the VHF tuner, it should be understood that the invention can be equally applied to the local oscillator for the UHF tuner, a preferred embodiment of which is shown in the circuit diagram of FIG. 6.

Referring to FIG. 6, numeral 61 designates an oscillation transistor, while 68 indicates a tuning inductor constituting a coaxial resonator of λ/4 type. In case of the UHF tuner, the changing-over of the tuning inductor is not usually carried out so that all the channels to be received can be covered. The oscillation transistor 61 is coupled to the tuning inductor 68 by way of a capacitor 66. The numeral 62 indicates a variable capacitive diode for the tuning which is applied with a tuning voltage $V_T$ through a resistor 72 from the terminal 82, thereby to vary the oscillation frequency.

The capacitance value of the capacitor 57 connected in series to the tuning capacitive diode 62 is determined from the viewpoint to improve the tracking characteristic of the high frequency circuit for the tuning frequency and the local oscillation frequency together with the coupling capacitor 66.

The numeral 63 denotes a variable capacitive diode for AFC which is applied with the AFC voltage $V_F$ through a resistor 65 from the terminal 83 and connected to the both terminals of the tuning capacitive diode 62 through capacitors 55 and 56. In operation, the capacitor 55 serves to increase the control sensitivity of the AFC circuit as the oscillation frequency becomes relatively lower, while the capacitor 56 performs the function of increasing the control sensitivity of the AFC circuit as the oscillation frequency becomes relatively higher. Accordingly, by selecting approapriately the capacitance values of the capacitors 55 and 56 so that the AFC control sensitivity may remain substantially at a same level both for the receptions of the high and the low bands, the inter-channel deviation in the AFC sensitivity can be reduced.

The present invention can not only be applied to the circuit employing the λ/4-resonator, but also to the circuit using a λ/2 resonator with substantially same advantages.

Although the invention has been described in connection with the embodiments in which the variable capacitive diode is employed as the means for varying the tuning frequency, it should be appreciated that the invention can never be restricted to these embodiments. For example, the invention may be applied to a local oscillation circuit in which a variable air capacitor is used, for example.

We claim:

1. A local oscillation circuit for a tuner provided with an automatic frequency control, comprising:
    an oscillation circuit including
    a variable capacitive element. element,
    a tuning inductance element coupled to said variable capacitive element to thereby form a resonance circuit, and
    an active element connected to said resonance circuit, whereby the oscillation frequency of said oscillation circuit is varied by changing the value of said variable capacitive element;
    a variable capacitive diode for automatic frequency control having a first terminal connected to a reference potential and a second terminal;
    a first coupling capacitor connected between said second terminal of said variable capacitive diode and a first circuit to which one electrode of said variable capacitive element is connected;
    a second coupling capacitor connected between said second terminal of said variable capacitive diode and a second circuit to which the other electrode of said variable capacitive element is connected; and
    means, connected to said variable capacitive diode, for applying a control voltage to said variable capacitive diode, so that the frequency of said oscillation circuit is controlled for reception of a desirable signal by said tuner.

2. A local oscillation circuit for a tuner provided with an automatic frequency control, comprising:
    an oscillation circuit including
    a variable capacitive element,
    a capacitor connected in series with said variable capacitive element,
    a tuning inductance element connected in parallel with the series connection of said capacitor and said variable capacitive element to thereby form a resonance circuit, and
    an active element connected to said resonance circuit, whereby the oscillation frequency of said oscillation circuit is varied by changing the value of said variable capacitive element;
    a variable capacitive diode for automatic frequency control having a first terminal connected to a reference potential and a second terminal,
    a first coupling capacitor connected between said second terminal of said variable capacitive diode and one electrode of said variable capacitive element of said resonance circuit;
    a second coupling capacitor connected between said second terminal of said variable capacitive diode and the other electrode of said variable capacitive element of said resonance circuit; and
    means, connected to said variable capacitive diode for, applying a control voltage to said diode, so that the frequency of said oscillation circuit is controlled for reception of a desirable signal by said tuner.

3. A local oscillation circuit for a tuner provided with an automatic frequency control, comprising:
    an oscillation circuit including
    a variable capacitive element, a tuning inductance element connected in series with said variable capacitive element to thereby form a resonance circuit, and an active element connected to said resonance circuit, whereby the oscillation frequency of said oscillation circuit is varied by changing the value of said variable capacitive element;

a variable capacitive diode for automatic frequency control having a first terminal connected to a reference potential and a second terminal;

a first coupling capacitor connected between said second terminal of said variable capacitive diode and one electrode of said variable capacitive element of said resonance circuit;

a second coupling capacitor connected between said second terminal of said variable capacitive diode and the other electrode of said variable capacitive element of said resonance circuit; and means, connected to said variable capacitive diode, for applying a control voltage to said variable capacitive diode, so that the oscillation frequency of said oscillation circuit is controlled for a reception of a desirable signal by said tuner.

4. A local oscillation circuit for a tuner provided with an automatic frequency control, comprising:

an oscillation circuit including a variable capacitive element, a tuning inductance element which comprises a high-band tuning coil having a first terminal connected to said variable capacitive element, a second terminal, and an intermediate terminal, and a low-band tuning coil connected to said second terminal of said high-band tuning coil, means for short-circuiting said low-band tuning coil when a high-band signal is received by said tuner, to thereby form a resonance circuit, and an active element connected to said resonance circuit, whereby the oscillation frequency of said oscillation circuit is varied by changing the value of said variable capacitive element;

a variable capacitive diode for automatic frequency control having a first terminal connected to a reference potential and a second terminal;

a first coupling capacitor connected between said second terminal of said variable capacitive diode and the electrode of said variable capacitive element to which said tuning inductance element is not connected;

a second coupling capacitor between said second terminal of said variable capacitive diode and said intermediate tap of said high-band tuning coil of said tuning inductance element; and means, connected to said variable capacitive diode, for appling a control voltage to said variable capacitive diode, so that the frequency of said oscillation circuit is controlled for reception of a desirable signal by said tuner.

* * * * *